United States Patent [19]
Jerbic

[11] Patent Number: 5,326,427
[45] Date of Patent: Jul. 5, 1994

[54] METHOD OF SELECTIVELY ETCHING TITANIUM-CONTAINING MATERIALS ON A SEMICONDUCTOR WAFER USING REMOTE PLASMA GENERATION

[75] Inventor: Chris Jerbic, Fremont, Calif.

[73] Assignee: LSI Logic Corporation, Milpitas, Calif.

[21] Appl. No.: 943,839

[22] Filed: Sep. 11, 1992

[51] Int. Cl.$^5$ .................... H01L 21/306; B44C 1/22; C03C 15/00
[52] U.S. Cl. .................... 156/643; 437/225; 437/228
[58] Field of Search ............ 156/643; 437/225

[56] References Cited

U.S. PATENT DOCUMENTS 4,874,459 10/1989 Coldren et al. .................... 156/643

OTHER PUBLICATIONS

Suto, Highly Selective Etching of $Si_3N_4$ to $SiO_2$ Employing Fluorine and Chlorine Atoms Generated by Microwave Discharge, J. Electrochem. Soc., vol. 136, No. 7, Jul. 1989, pp. 2032-2034.

Primary Examiner—Brian E. Hearn
Assistant Examiner—B. Everhart
Attorney, Agent, or Firm—Gerald E. Linden

[57] ABSTRACT

A method of selectively etching titanium-containing materials without attacking aluminum or silicon dioxide is describe, wherein an atomic chlorine etching environment is generated using downstream techniques. Atomic chlorine in the absence of ion bombardment (as provided by downstream etching) etches titanium-containing materials such as titanium nitride without attacking silicon dioxide. In one embodiment of the invention, atomic chlorine is generated by the discharge of energy into molecular chlorine. In another embodiment of the invention, discharge of energy into a fluorine-containing gas causes the generation of atomic fluorine. Molecular chlorine is then added, creating a fluorine-chlorine exchange reaction which produces atomic chlorine. The presence of fluorine inhibits etching of aluminum, but does not impede the etching of titanium-containing materials.

11 Claims, 5 Drawing Sheets

METHOD OF SELECTIVELY ETCHING TITANIUM-CONTAINING MATERIALS ON A SEMICONDUCTOR WAFER USING REMOTE PLASMA GENERATION

TECHNICAL FIELD OF THE INVENTION

The invention relates to processing and fabrication of semiconductor wafers, more particularly to etching of materials deposited on a semiconductor substrate, and still more particularly to selective etching of titanium and titanium compounds deposited on a semiconductor substrate.

BACKGROUND OF THE INVENTION

In the processing of a semiconductor wafer to form integrated circuits, it is common to etch holes through one or more layers of materials formed on the wafer to provide access to underlying materials. Typically, this is done to permit conductive materials to be deposited in these holes for the purpose of creating contacts for external connections circuits or conductive "vias" between different internal wiring layers. Via holes provide electrical access to underlying metal conductive layers (wiring layers) while contact holes provide electrical access to underlying silicon or polysilicon (e.g., source or drain diffusion regions or gate polysilicon). In the process of etching these holes, formations called "fences" are known to be created on vertical surfaces (e.g., the "walls" of the holes). These fences are formed of a carbon-fluorine-silicon-oxygen polymer that is a natural result of the etching process and which is deposited evenly across the wafer. On horizontal surfaces, the polymer is removed as fast as it is deposited by ion bombardment that occurs on those surfaces during etching. On vertical surfaces, however, the polymer builds up creating "fences".

If fences are left on the wafer, it can be difficult, if not impossible, to create good contacts or vias due to poor adhesion of the contact material, contamination, or step coverage problems (i.e., inability to completely fill the holes with conductive material) leading to high contact resistance with the underlying material. Typically, fences are removed with organic solvents (such as NMP) prior to depositing conductive materials.

During the etching of contact holes to underlying silicon or polysilicon, the "fence" polymer has the beneficial side-effect of protecting silicon and polysilicon materials (commonly used in silicon-based integrated circuit structures) from being attacked by the etching process. The polymer has no beneficial effect when via holes are etched to underlying metal.

In modern integrated circuit devices, aluminum (chemical symbol "Al") is commonly used as an internal interconnect (wiring) material and for contacts. Titanium and titanium compounds, such as titanium nitride (hereinafter referred to by its chemical formula "TiN") are used as an antireflective coating over aluminum, as a diffusion barrier under aluminum, and as an adhesion layer under tungsten (chemical symbol "W"), which is often used to fill contact and via holes. Small geometries of modern integrated circuits have necessitated the use of "dull" antireflective materials, such as TiN, over shiny materials, such as aluminum, to prevent reflections off of the shiny materials from affecting "photo" processes.

Hereinafter, titanium and titanium compounds will be referred to collectively as "titanium-containing materials", and will be understood to encompass both elemental titanium and titanium compounds.

In the process of etching contact or via holes (e.g., by plasma etching, well known to those skilled in the art), if Al is exposed to the etching process, it may be rapidly "sputtered" about and becomes incorporated into the fence polymer. This makes the fence polymer difficult to remove effectively, since removal of an Al-tainted fence requires the use of solvents which also attack the aluminum wiring material. A similar effect can occur if a titanium-containing material is encountered during the etching process, similarly causing titanium to be incorporated into the fence polymer, creating a Ti-tainted fence, which is equally difficult to remove effectively. (It is also possible to incorporate both titanium and aluminum into a fence.)

In integrated circuits where TiN is used, it is often desirable to etch away just the TiN in a selective etch process. Three techniques of etching TiN are known in the prior art:

Etching in a fluorine plasma with high ion bombardment,

Etching in a chlorine plasma

Wet etching

Wet etching may remove thin films of TiN, but cannot be used in small contact holes or vias. Surface tension in combination with the small size of the holes prevents the etchant from reliably wetting the bottom of the contact holes or vias. A vacuum method of etching is preferable, to help ensure contact of the TiN film with the etchant.

Fluorine plasma for etching with high ion bombardment is most commonly used as an over-etch step for etching vias and contact holes. This method has the following problems:

The etch rate of the TiN is very slow (10% of the etch rate of $SiO_2$). The etch process removes photoresist as well as titanium-containing materials, exposing underlying materials to the etch process. If the photoresist is completely removed, oxide ($SiO_2$) loss from the top surface of the wafer and alteration of the profile of the via or contact hole are likely.

A polymer is formed in the via (or contact) hole consisting of titanium, aluminum, oxygen, silicon, and carbon. The polymer must be removed to ensure device reliability, but is extremely difficult to remove selectively without causing damage to or erosion of other materials.

A chlorine plasma environment may also be used to etch titanium-containing materials, but after the titanium-containing materials are removed, aluminum may be exposed to the plasma. In this case, chlorine is incorporated in the aluminum and causes undesired aluminum etching or corrosion.

Figure 1A:
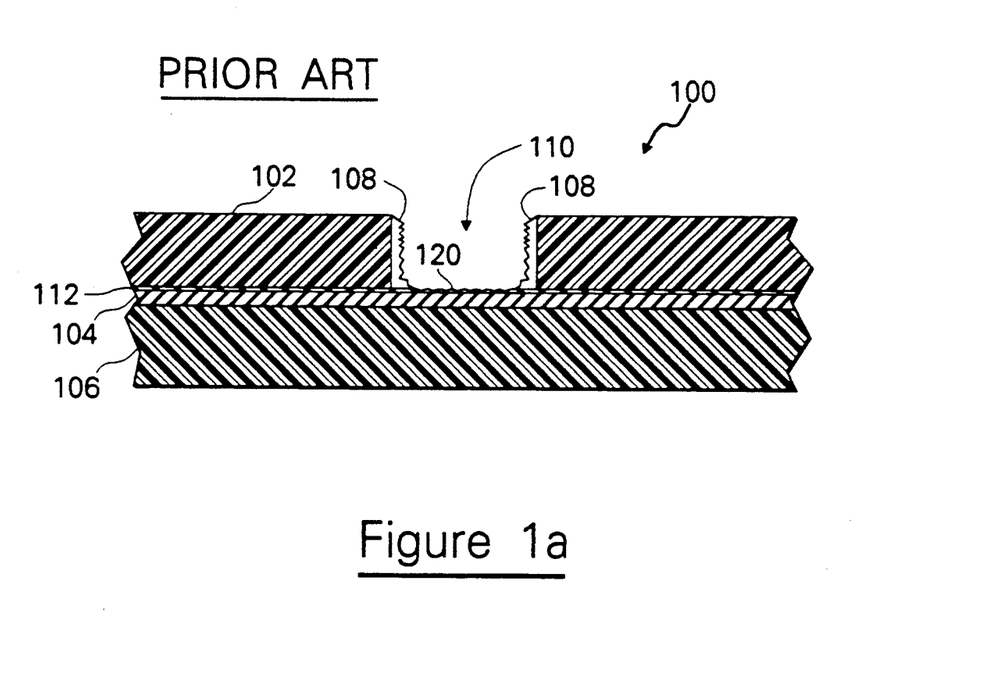
FIGS. 1a-1e show various applications of titanium-containing materials to semiconductor wafer in the prior art, and illustrate the various problems with prior art techniques for etching titanium-containing materials.

FIG. 1a shows a semiconductor device 100 having an upper surface formed by a layer of insulating material (usually $SiO_2$) into which a via hole 110 has been etched by a process such as plasma etching. Underlying the insulating material 102 is an aluminum conductive wiring layer 104, over which an anti-reflective film of titanium-containing material 112 has been deposited. Underlying the aluminum wiring layer 104 is another insulating layer 106. A polymer 108 is shown on the walls of hole 110 as a result of the etching process. Ordinarily, titanium-containing materials are sufficiently conductive to provide good electrical contact, but damage 120 done to the surface titanium-containing material during the process of etching hole 110 would cause poor contact between any conductive material deposited in hole 110 and aluminum 104 it the damaged titanium material 120 were allowed to remain. Therefore, it is desirable to remove the damaged titanium material 120 prior to depositing any conductive material in the via hole.

Figure 1B:
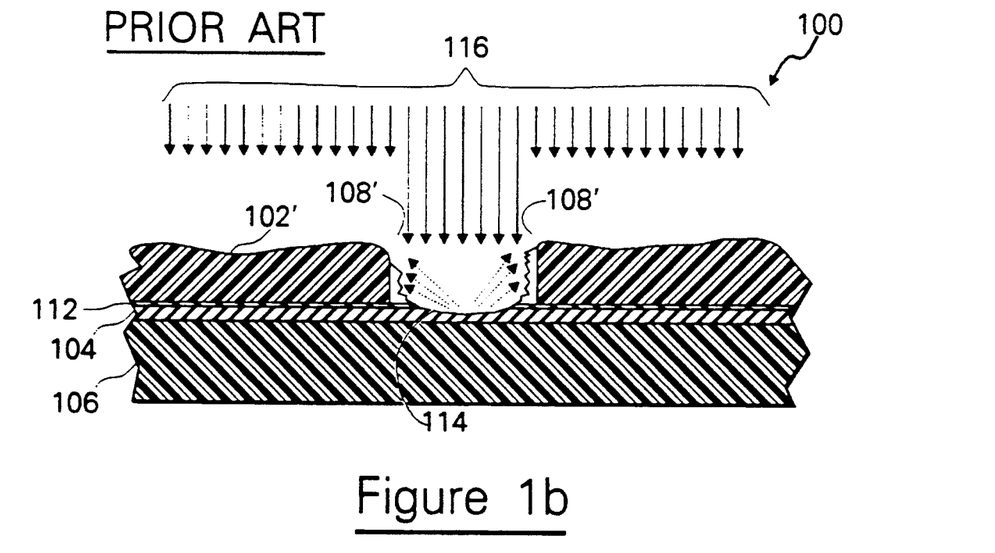

FIG. 1b illustrates a prior-art fluorine plasma etching process 116 applied to wafer 100 to remove .the damaged titanium material 120 of FIG. 1b. (It is assumed that there is a photoresist applied to the top surface of the wafer to mask off the via hole prior to etching, but since the photoresist is attacked and removed by the fluorine plasma etching process, it is not shown). After removal of the damaged titanium material 120, aluminum 104 is exposed in the area shown by 114, and is rapidly sputtered and incorporated into an aluminum containing polymer 108'. (Titanium is also incorporated into the polymer as the damaged titanium material 120 is etched). The overlying insulating layer 102 is eroded by the etching process 116 once any photoresist is gone, causing oxide loss resulting in a thinned insulating layer 102'. The aluminum-containing polymer is extremely difficult to remove without causing significant further damage to aluminum 104 in the area shown by 114.

Figure 1C:
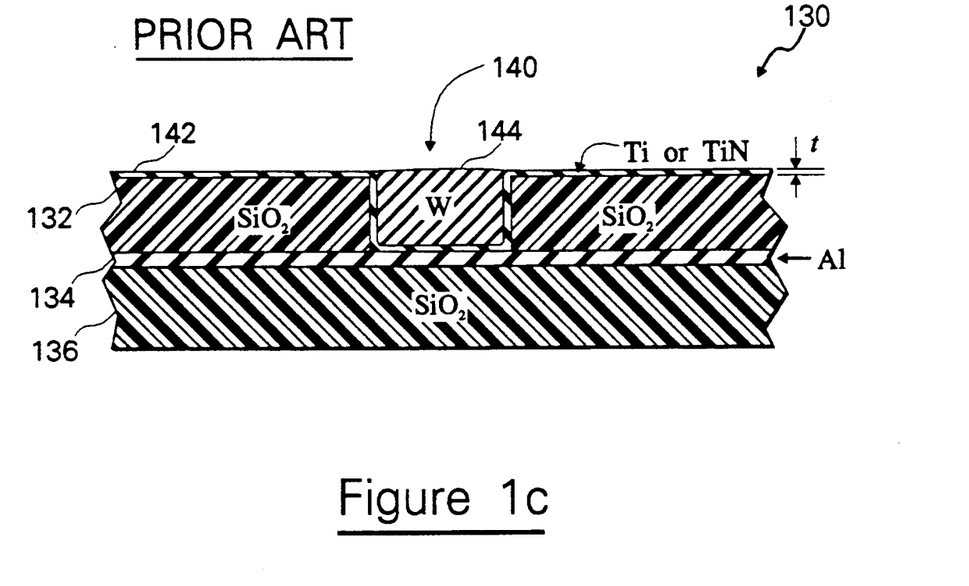

FIG. 1c shows another wafer 130 having a lower insulating layer 136, an aluminum conductive wiring layer 134 overlying layer 136, and an upper insulating layer 132 overlying layers 134 and 136. A hole 140 has been etched into upper insulating layer 132 by a suitable etching process. A film of a titanium-containing material 142 has been deposited over the upper insulating layer 132, completely covering layer 132 and the surface of hole 140. The titanium-containing material 142 provides an adhesion layer for a tungsten (W) plug 144 which has been deposited into hole 140. Titanium-containing material 142 is sufficiently conductive and sufficiently thin that good electrical contact is provided between aluminum 134 and tungsten 144. However, a thickness "t" of titanium containing material 142 overlying the top surface of upper insulating layer 132 effectively "shorts out" any other similarly deposited tungsten plugs, and must be removed.

Figure 1D:
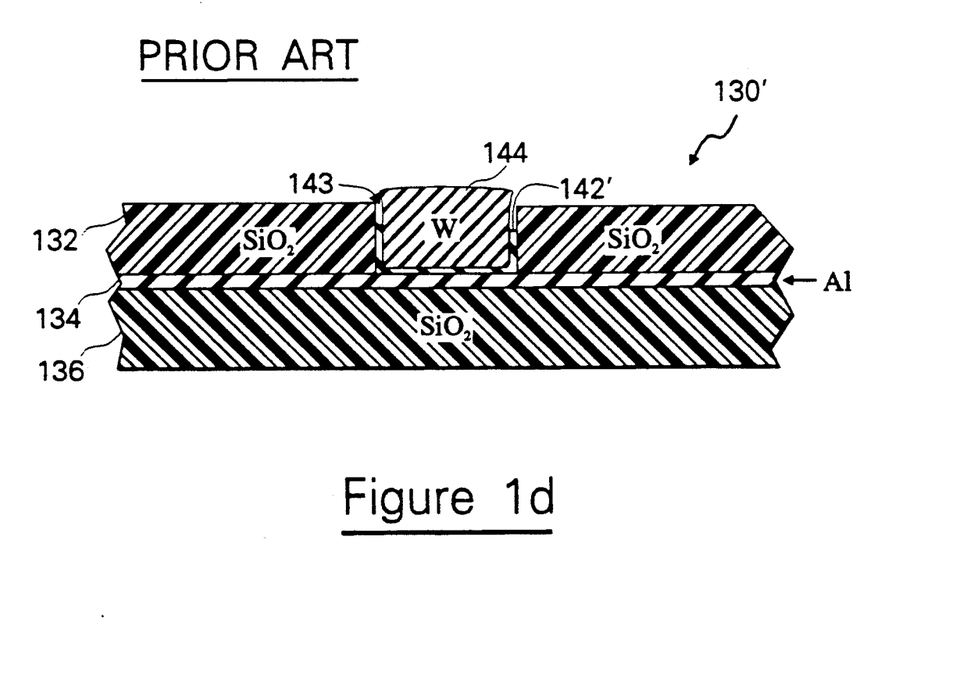

FIG. 1d shows the same wafer 130' after removal of the thickness "t" of titanium-containing material. Because prior-art techniques of removing titanium-containing materials do not provide good control of the degree of etch, it is possible titanium-containing material 142 (with respect to FIG. 1c) to be removed around the sides of tungsten plug 144, leaving the shape shown as 142'. This causes undesirable trenches 143 around the tungsten plug 144.

FIGS. 1a–1d all show via holes (i.e., holes which make contact with an underlying wiring layer. The discussion hereinabove, however, is also applicable to contact holes.

Figure 1E:
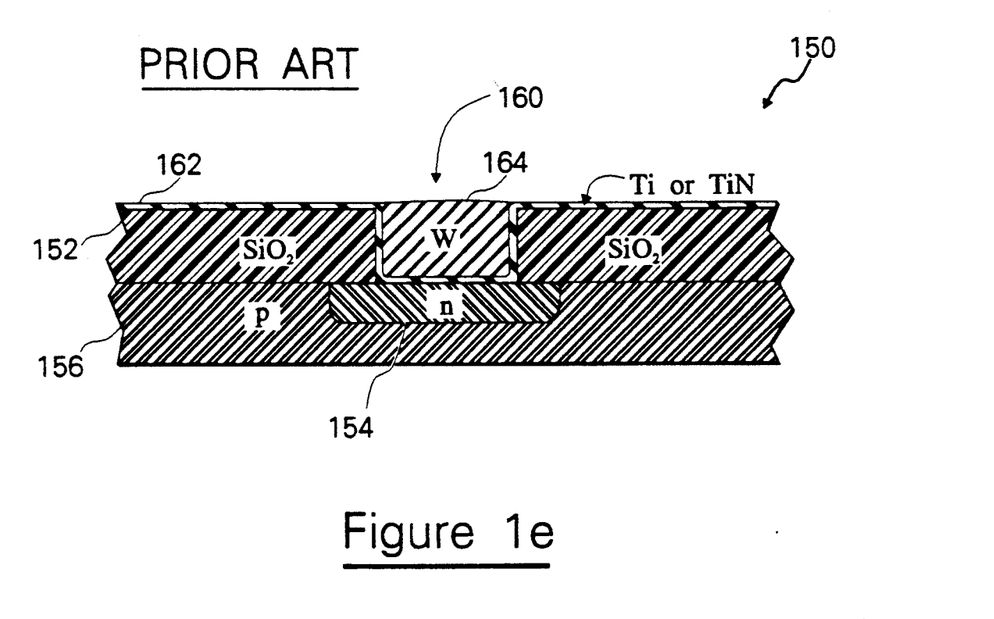

FIG. 1e shows a wafer 150 wherein a contact hole 160 is etched into an oxide layer 152 to provide electrical access to a silicon n-diffusion region 154 in a p-material 156 underlying oxide layer 152. A thin coating of a titanium-containing material 162, such as titanium nitride, is applied over the oxide layer 152 and hole 160 as an adhesion layer for a tungsten plug 164 deposited into hole 160 over the layer 162 of titanium-containing material. The problem of etching the titanium layer 162 is essentially identical to that of FIGS. 1c and 1d.

DISCLOSURE OF THE INVENTION

It is therefore an object of the present invention to provide an etching technique which provides good selectivity to titanium-containing materials over silicon dioxide ($SiO_2$).

It is a further object of the present invention to provide an etching technique which provides good selectivity to titanium-containing materials over aluminum.

It is a further object of the present invention to provide, in addition to the aforementioned objects, an technique for etching titanium-containing materials which functions well in small via and contact holes.

It is a further object of the present invention to provide a technique for etching titanium-containing materials which prevents aluminum and titanium from being incorporated into fence polymers.

According to the invention, a wafer having exposed titanium-containing material is placed in a reaction chamber. The exposed titanium containing material is selectively etched in an atomic chlorine environment by generating an "upstream" gaseous environment containing atomic chlorine using an energy discharge technique, then transporting this gaseous environment through a tube between the site of the energy discharge and the reaction chamber. The tube is sufficiently long that any ions in the gaseous environment are recombined prior to reaching the reaction chamber, but short enough that the longer-lived atomic chlorine remains.

The observation is made that titanium-containing materials are etched well by atomic chlorine. It is also observed that the etching of titanium-containing materials by atomic chlorine is not enhanced by ion bombardment. Further, it is observed that an atomic chlorine environment in the absence of ion bombardment does not significantly etch silicon dioxide ($SiO_2$). As a result, the "downstream" reaction chamber is free of ionization, but contains atomic chlorine, which etches the titanium-containing material while leaving oxides (e.g., $SiO_2$) substantially unaffected.

In one embodiment of the invention, an atomic chlorine environment is generated in the presence of fluorine by applying energy to a fluorine-containing gas to generate atomic fluorine. Molecular chlorine ($Cl_2$) is then added to this gaseous environment downstream of the energy discharge site. The molecular chlorine exchanges with the atomic fluorine to create FCl and atomic chlorine (Cl). This environment is further transported to the reaction chamber where the titanium-containing material is etched by the atomic chlorine.

It is observed that the presence of fluorine in an atomic chlorine environment (in the absence of ion bombardment) inhibits the etching of aluminum without inhibiting the etching of titanium-containing materials.

In another embodiment of the invention, the atomic chlorine is generated by generating a chlorine plasma. The plasma chamber joined to the reaction chamber by a tube of sufficient length to permit ion recombination, but short enough that longer-lived atomic chlorine reaches the reaction chamber.

In another embodiment of the invention the atomic chlorine is created by discharge of high-frequency energy, such as microwave energy or RF energy, into molecular chlorine, then passed into a downstream etching chamber.

In another embodiment of the invention, atomic fluorine is generated in a plasma chamber, then combined with molecular chlorine in a downstream chamber to form a fluorine-chlorine exchange reaction which acts as a selective etchant.

In another embodiment of the invention, atomic fluorine is generated by the discharge of high-frequency energy, such as microwave energy or RF energy into a fluorine-containing gas such as CF$_4$, then combining it with molecular chlorine in a downstream chamber to form a fluorine-chlorine exchange reaction which acts as a selective etchant.

In this manner, various techniques are provided which selectively etch titanium and titanium-containing materials such as titanium nitride.

Other objects, features and advantages of the invention will become apparent in light of the following description thereof.

DETAILED DESCRIPTION OF THE INVENTION

The technique of generating atomic species in the absence of ion bombardment by using "downstream" techniques is known in the prior art. Such a technique is described with regard to the etching of Si$_3$N$_4$ selectively over SiO$_2$ in "Highly Selective Etching of Si$_3$N$_4$ to SiO$_2$ Employing Fluorine and Chlorine Atoms Generated by Microwave Discharge" J. Electrochem. Soc. , Vol. 136, No. 7, July, 1989. This paper describes etching of silicon nitride selectively in a downstream apparatus referred to therein as a "down-flow type reactor." "Downstream" techniques have the characteristic of preserving atomic species (such as atomic fluorine and/or chlorine) while eliminating ionized species. This is because atomic species are longer lived than are ionized species, and if the gases produced by an ionizing energy are transported to a reaction chamber by a tube of sufficient length (thereby providing an appropriate transit time), ionized species will have recombined but atomic species will remain when the gases reach the reaction chamber.

Chlorine (and fluorochlorine) plasmas are known in the prior art to etch titanium-containing materials. However, such plasmas are relatively "chaotic" environments which cause any number of undesirable side effects. Heretofore, little information has been available in the prior art about the etch mechanisms and etch characteristics of titanium-containing materials. Research resulting in a paper "Investigations of TiN Etch Mechanisms in a Cl$_2$/N$_2$ Plasma", appended hereto and forming a part of the specification hereof, shows that atomic chlorine is primarily responsible for the etching of titanium-containing materials, and that this etch process is essentially unaffected by ion bombardment. Further, it is known that the etch rate of silicon dioxide (SiO$_2$) is dramatically affected by ion bombardment, and is effectively stopped in the absence of ions.

These observations raise the possibility of etching titanium-containing materials selectively to SiO$_2$ by using a "down-flow type reactor" to generate atomic chlorine in the absence of ion bombardment. Further research proved this technique to be viable.

It has also been observed that the presence of fluorine in the atomic chlorine environment inhibits the etching of aluminum. This observation. By making use of an exchange reaction wherein atomic fluorine exchanges with molecular chlorine as shown below it is possible to add molecular chlorine to fluorine generated by energy discharge in a downstream chamber to provide an atomic chlorine etching environment with fluorine present.

$$F + Cl_2 \longrightarrow FCl + Cl$$

Figure 2A:
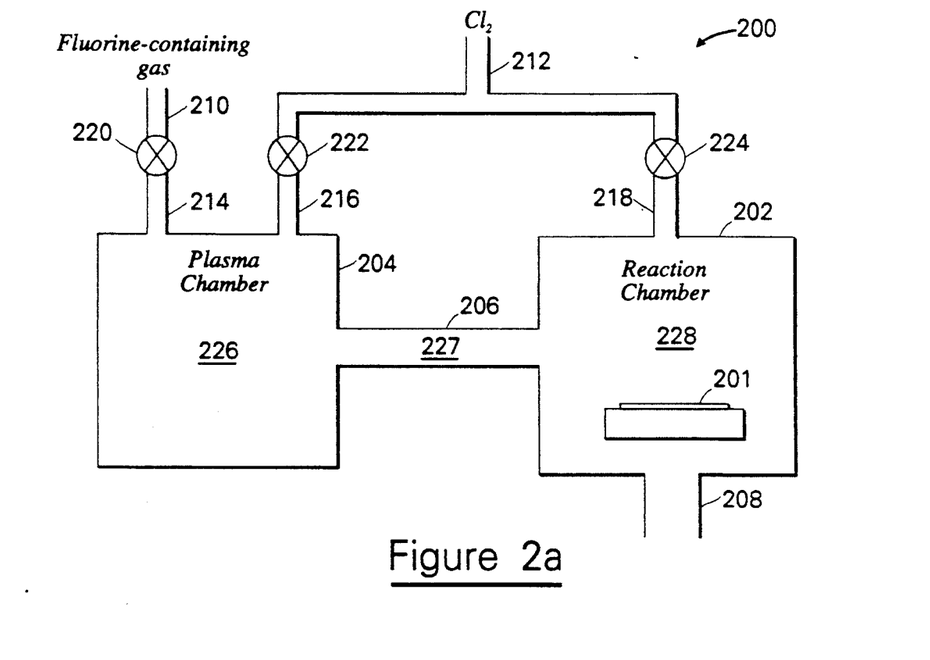
FIGS. 2a and 2b show two different embodiments of the technique of the present invention with respect to the generation of atomic species in a downstream etching environment.

FIG. 2 shows a technique 200 for etching a wafer 201 having exposed titanium-containing material in a reaction chamber 202 joined to a plasma chamber 204 by a tube 206. Reaction chamber 202 has an exhaust port 208. Pressurized fluorine-containing gas, such as CF$_4$, in a fluorine supply tube 210 passes through a fluorine control valve 220 (when opened) and a tube 214 into plasma chamber 204. Pressurized molecular chlorine gas (Cl$_2$) in a supply tube 212 passes through a chlorine control valve 222 (when opened) and tube 216 into plasma chamber 204. Molecular chlorine gas also passes through a second chlorine control valve 224 (when opened) and another tube 218 into reaction chamber 202. (Only fluorine-containing gas and chlorine gas are relevant to the present invention, other gases and species are not shown.

If titanium-containing material is to be etched, but no aluminum will be exposed in the process (see, for example FIGS. 1c and 1e), then fluorine control valve 220 is closed. chlorine control valve 222 is opened permitting the flow of molecular chlorine into plasma chamber 204. Second chlorine control valve 224 is closed. A plasma 226 (in this case, a chlorine plasma) is generated by applying an ionizing energy source. Plasma 226, in this case contains atomic chlorine and ionized species. The flow of gas into plasma chamber 204 causes the gaseous environment therein to be transported through tube 206 to the reaction chamber 202, forming a gaseous reaction environment 228. In the area generally indicated by 227, ions recombine. Atomic species of chlorine, however, have a longer life and are transported into the gaseous reaction environment 228. The atomic chlorine etches the titanium-containing material on wafer 201 without damaging any underlying oxide.

In the event that aluminum will be exposed as the titanium containing material is removed (see, for example, FIGS. 1a and 1b) then an alternative technique may be used whereby fluorine control valve 220 is opened, chlorine control valve 222 is closed, and second chlorine control valve 224 is opened. This permits the flow of a fluorine containing gas, (CF$_4$ for this example) into the plasma chamber 204. The plasma chamber 204 generates a gaseous plasma 226 including CF$_3$, atomic fluorine, and ionized species. The gaseous environment is transported through tube 206 to reaction chamber 202. Ions are recombined in tube 206 in the area generally indicated by 227. The gases exiting tube 206 combine with molecular chlorine gas entering the reaction chamber 202 to form a gaseous reaction environment 228. In this case, the atomic chlorine etchant is formed by the aforementioned exchange reaction between atomic fluorine and molecular chlorine. The presence of fluorine in the gaseous reaction environment 228 inhibits etching of aluminum, but does not impede the etching of titanium-containing materials.

Figure 2B:
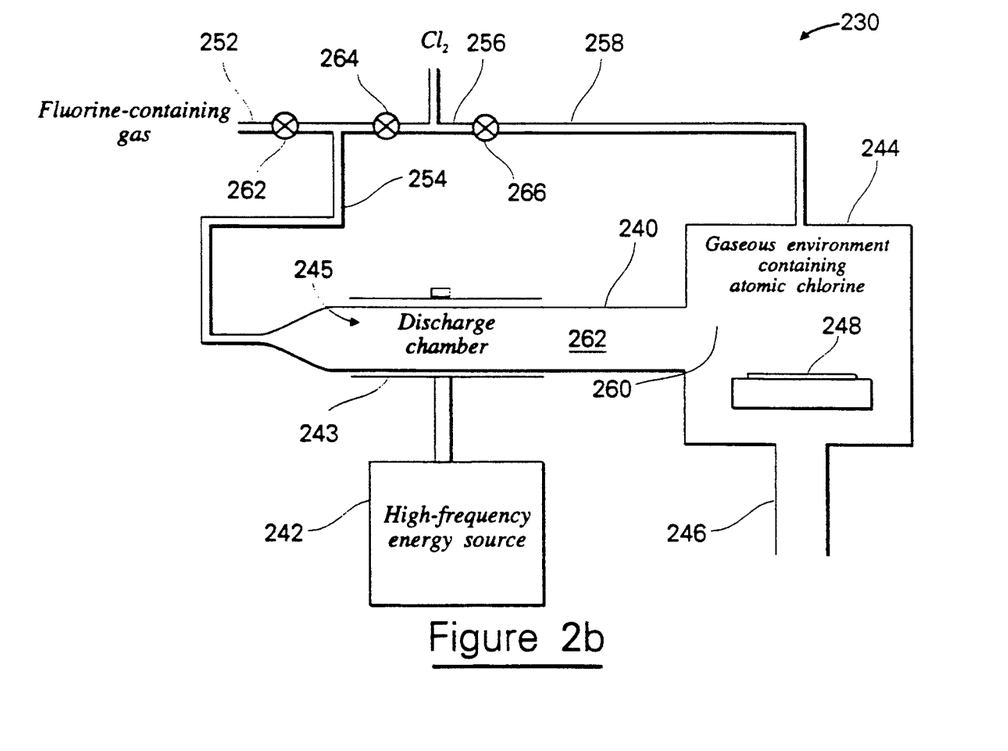

FIG. 2b shows another embodiment of the invention: a technique 230 for etching titanium-containing material on a wafer 248 generates atomic chlorine by the discharge of high frequency energy (such as RF energy or microwave energy) from a high-frequency energy source 242 via discharge means 243 into a gaseous environment in discharge area 245. Pressurized fluorine-containing gas, such as $CF_4$ in a supply tube 252 is admitted through a tube 254 to discharge chamber (tube) 240 into discharge area 245. Pressurized molecular chlorine gas in a supply tube 256 is admitted by valve 264 through tube 254 into discharge area 245 of discharge chamber 240. Energy discharge means 243 apply the high-frequency energy from high-frequency energy source 242 to the gas(es) in discharge area 245. creating atomic species and ionized species. Discharge chamber 240 is sufficiently long in an area 262 removed from the discharge area 245 that ion recombination occurs as gases pass through this area, but atomic species survive and are passed into a gaseous environment 260 in reaction chamber 244. Molecular chlorine gases is admitted by valve 266 through a tube 258 into reaction chamber 244.

Other than the specific energy discharge mechanism used to generate the atomic species, this apparatus is essentially identical to the apparatus of FIG. 2a. Instead of a plasma chamber (204) as in FIG. 2a, this technique uses a discharge chamber 240. Only a portion (245) of the discharge chamber 240 is actually used for energy discharge into a gaseous environment, leaving a significant remaining portion of discharge chamber 240 removed from the discharge area 245. This area is analogous to tube 206 with respect to FIG. 2a. Valve 262 corresponds to valve 220, valve 264 corresponds to valve 222, and valve 266 corresponds to valve 224. The operation of these valves and the resulting reactions are identical to those discussed with respect to FIG. 2a. The only difference is that instead of using a plasma to generate the atomic species, the technique of FIG. 2b uses high-frequency energy discharge. In one embodiment of the invention this high-frequency energy is microwave energy. In another embodiment of the present invention, the high-frequency energy is radio-frequency (RF) energy. Discharge of microwave energy and RF energy are both known to those of ordinary skill in the art.

Figure 3A:
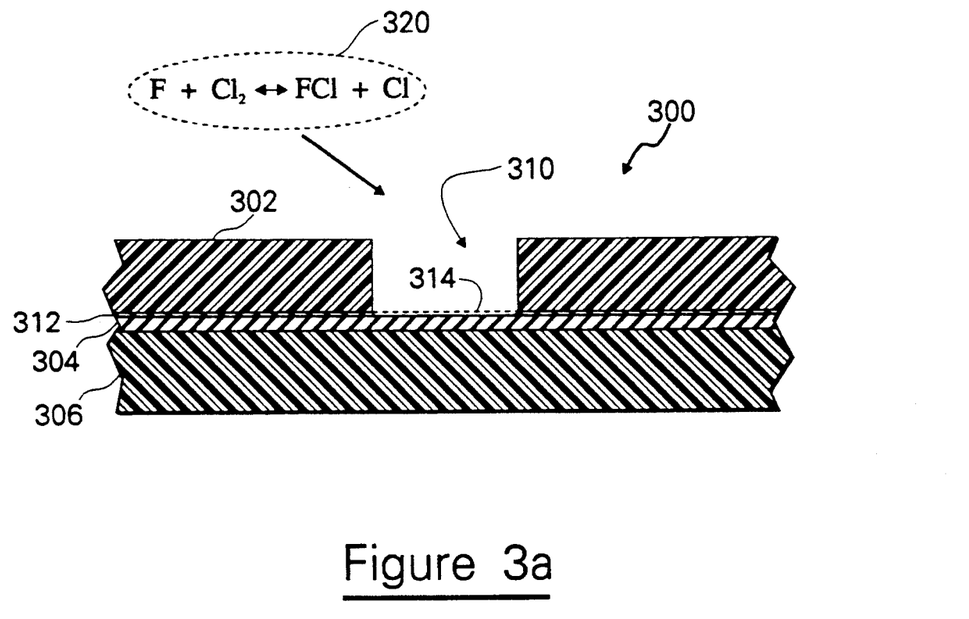
FIGS. 3a and 3b illustrate the application of the present inventive technique to two different titanium etching situations on a semiconductor wafer.

FIG. 3a shows etching of titanium-containing material 314 on a wafer 300 in a fluorine-chlorine exchange environment 320, wherein titanium-containing material 314 is etched selectively without etching underlying aluminum 304 and without eroding an upper oxide layer 302. A hole 310, etched into upper oxide layer 302 exposes a portion 314 (shown as dashed lines) of a layer 312 of titanium-containing material overlying an aluminum wiring layer 304. Underlying all of this is lower oxide layer 306. In the presence of atomic chlorine in the fluorine-chlorine exchange environment, the portion 314 of the layer 312 of the titanium containing material in hole 310 is etched away, exposing aluminum wiring layer 304. Fluorine in the fluorine-chlorine exchange environment inhibits etching of aluminum layer 304 by the atomic chlorine. The fluorine-chlorine exchange may be generated by a downstream technique as described hereinabove with respect to FIGS. 2a and 2b.

Figure 3B:
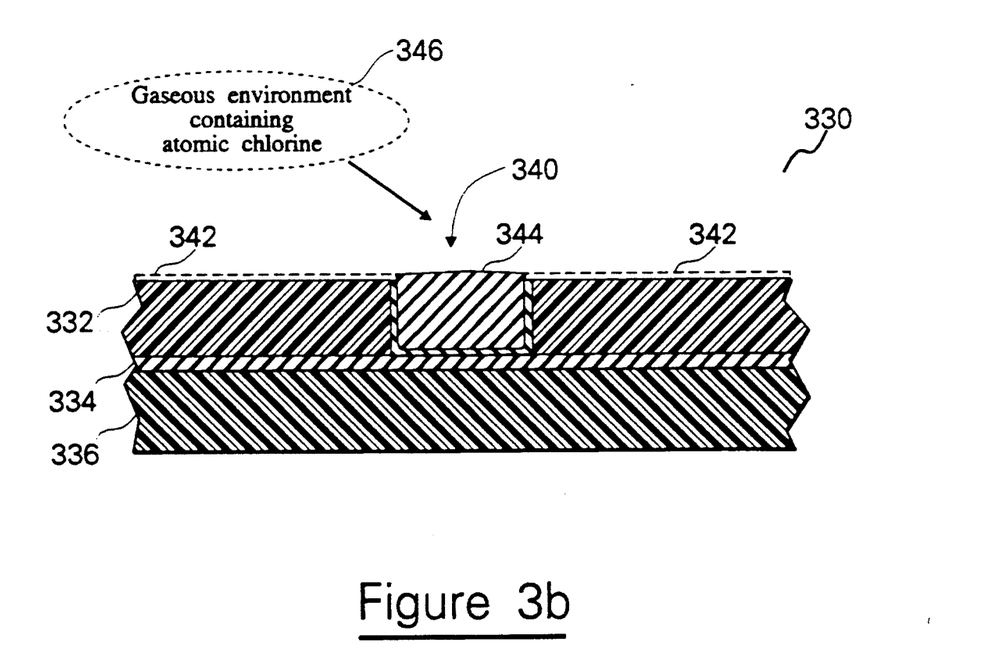

FIG. 3b shows etching of titanium-containing material 342 on top of a wafer 330 in a gaseous environment 346 containing atomic chlorine, wherein titanium-containing material 342 is etched selectively without etching an underlying upper oxide layer 332 and without creating trenches around a tungsten plug 344 deposited into a hole 340 etched into layer 332. Tungsten plug 344 makes electrical contact with an underlying aluminum wiring layer through hole 340. The titanium-containing material provides a good adhesion to the tungsten plug 344. Underlying all of this is lower oxide layer 336. In the presence of atomic chlorine in the gaseous environment 346, the exposed portions of the layer 342 of the titanium containing material (shown as dashed lines) are etched away, exposing but not eroding underlying oxide layer 332. The gaseous environment 346 may be generated by the downstream techniques discussed hereinabove with respect to FIGS. 2a and 2b.

While FIGS. 3a and 3b show application to via holes, whereby electrical contact is made to an underlying wiring layer, the technique of the present invention is equally applicable to contact holes (see for example, FIG. 1e) wherein the underlying material to which contact is made is silicon or polysilicon.

What is claimed is:

1. A method of selectively etching titanium-containing material on a semiconductor wafer in an atomic chlorine environment comprising:

providing an energy discharge chamber;
   providing a reaction chamber;
   providing a semiconductor wafer having exposed titanium-containing material to be etched in the reaction chamber;
   providing an energy source;
   providing a flow of gas including molecular chlorine into the energy discharge chamber;
   providing means for applying the energy from the energy source to the gas flowing into the energy discharge chamber;
   applying the energy from the energy source to the gas flowing into the energy discharge chamber to produce a discharge gas including atomic chlorine and ionized species;
   providing a passageway for gas to pass from the energy discharge chamber and the reaction chamber, said passage of gas through the passageway into the reaction chamber requiring a passage time;
   providing a flow of discharge gas from the energy discharge chamber into the passageway;
   said passageway being of sufficient length that the ionized species in the discharge gas will recombine during the passage time therethrough;
   said passageway being sufficiently short that the atomic chlorine will survive longer than the passage time therethrough;
   said passage time of discharge gas through the passageway thereby causing a transformation of the resultant gas into an etching gas containing atomic chlorine, but free of ionized species; and
   exposing the semiconductor wafer to the etching gas in the reaction chamber, thereby etching the exposed titanium-containing material on the semiconductor wafer.

2. A method of selectively etching titanium-containing material on a semiconductor wafer, according to claim 1, wherein:

a plasma chamber provides the energy chamber and means for applying the energy from the energy source to the gas flowing in the energy discharge chamber.

3. A method of selectively etching titanium-containing material on a semiconductor wafer, according to claim 1, wherein:
the energy source is a microwave energy source; and
the energy from the energy source is microwave energy.

4. A method of selectively etching titanium-containing material on a semiconductor wafer, according to claim 1, wherein:
the energy source is an RF source; and
the energy from the energy source is RF energy.

5. A method of selectively etching titanium-containing material on a semiconductor wafer in a fluorine-containing exchange environment comprising:
providing an energy discharge chamber;
providing a reaction chamber;
providing a semiconductor wafer having exposed titanium-containing material to be etched in the reaction chamber;
providing an energy source;
providing a flow of gas including a fluorine-containing gas into the energy discharge chamber;
providing means for applying the energy from the energy source to the gas flowing into the energy discharge chamber;
applying the energy from the energy source to the gas flowing into the energy discharge chamber to produce a discharge gas including atomic fluorine and ionized species;
providing a passageway for gas to pass from the energy discharge chamber and the reaction chamber, said passage of gas through the passageway into the reaction chamber requiring a passage time;
providing a flow of discharge gas from the energy discharge chamber into the passageway;
said passageway being of sufficient length that the ionized species in the discharge gas will recombine during the passage time therethrough;
said passageway being sufficiently short that the atomic fluorine will survive longer than the passage time therethrough;
said passage time of discharge gas through the passageway thereby causing a transformation of the resultant gas into an etching gas containing atomic fluorine, but free of ionized species; and
said flow of discharge gas into the passageway causing a corresponding flow of gas exiting the passageway into the reaction chamber;
providing a flow of molecular chlorine gas such that it mixes with the intermediate gas, thereby creating an etching gas in the reaction chamber in which a fluorine-chlorine exchange reaction occurs; and
exposing the semiconductor wafer to the etching gas in the reaction chamber, thereby etching the exposed titanium-containing material on the semiconductor wafer.

6. A method of selectively etching titanium-containing material on a semiconductor wafer, according to claim 5, wherein:
a plasma chamber provides the energy chamber and means for applying the energy from the energy source to the gas flowing in the energy discharge chamber.

7. A method of selectively etching titanium-containing material on a semiconductor wafer, according to claim 5, wherein: the energy source is a microwave energy source; and the energy from the energy source is microwave energy.

8. A method of selectively etching titanium-containing material on a semiconductor wafer, according to claim 5, wherein:
the energy source is an RF source; and
the energy from the energy source is RF energy.

9. A method of selectively etching titanium-containing material on a semiconductor wafer, according to claim 5, wherein:
the fluorine-containing gas is $CF_4$.

10. Method of etching titanium-containing materials on a semiconductor wafer, comprising:
disposing a semiconductor wafer in a reaction chamber, the semiconductor wafer including titanium-containing materials;
introducing a fluorine-containing gas to a plasma chamber;
creating a plasma in the plasma chamber, thereby generating a gas containing atomic fluorine;
providing the gas containing atomic fluorine to a tube connecting the plasma chamber to the reaction chamber, the tube having a length;
introducing a gas containing molecular chlorine to the gas containing atomic fluorine at a position along the length of the tube between the plasma chamber and the reaction chamber, thereby creating a gas rich in atomic chlorine;
introducing the gas rich in atomic chlorine to the reaction chamber to etch the titanium-containing materials on the semiconductor wafer.

11. Method of etching titanium-containing materials on a semiconductor wafer, comprising:
disposing a semiconductor wafer in a reaction chamber, the semiconductor wafer including titanium-containing materials;
generating a chlorine plasma in a plasma chamber remote from the reaction chamber, said chlorine plasma rich in atomic chlorine and having ions; and
communicating the chlorine plasma to the reaction chamber via a tube, said tube having a length sufficient to allow recombination of the ions present in the chlorine plasma so that there is a low concentration of said ions introduced to the reaction chamber, and said tube being limited in length so that there is a high concentration of atomic chlorine introduced to the reaction chamber.

* * * * *